(12) United States Patent
Cohen et al.

(10) Patent No.: US 9,928,328 B1
(45) Date of Patent: Mar. 27, 2018

(54) METHOD AND SYSTEM FOR AUTOMATED DEBUGGING OF A DEVICE UNDER TEST

(71) Applicant: CADENCE DESIGN SYSTEMS, INC., San Jose, CA (US)

(72) Inventors: Ynon Cohen, Kfar-Saba (IL); Tal Tabakman, Tel Aviv (IL); Yonatan Ashkenazi, Rehovot (IL); Chung-Wah Norris IP, Cupertino, CA (US); Nadav Chazan, Ness Ziona (IL); Gavriel Leshem, Tel Aviv (IL)

(73) Assignee: Cadence Design Systems, Inc., San Jose, CA (US)

( * ) Notice: Subject to any disclaimer, the term of this patent is extended or adjusted under 35 U.S.C. 154(b) by 57 days.

(21) Appl. No.: 15/164,514

(22) Filed: May 25, 2016

(51) Int. Cl.
 *G06F 17/50* (2006.01)
(52) U.S. Cl.
 CPC ...... *G06F 17/5045* (2013.01); *G06F 17/5009* (2013.01)
(58) Field of Classification Search
 CPC .......... G06F 17/5045; G06F 17/5009
 See application file for complete search history.

(56) References Cited

U.S. PATENT DOCUMENTS

| | | | | |
|---|---|---|---|---|
| 7,137,078 B2 * | 11/2006 | Singhal | ............... | G06F 17/5022 716/102 |
| 7,437,694 B1 * | 10/2008 | Loh | ............ | G06F 17/5022 716/136 |
| 7,454,324 B1 * | 11/2008 | Seawright | .......... | G06F 17/5022 703/14 |
| 8,104,001 B2 * | 1/2012 | Lehavot | ............ | G06F 17/5081 716/106 |
| 8,381,148 B1 * | 2/2013 | Loh | ........ | G06F 17/505 703/16 |
| 9,021,409 B2 * | 4/2015 | Vasudevan | ........... | G06F 17/504 716/106 |

* cited by examiner

*Primary Examiner* — Naum B Levin
(74) *Attorney, Agent, or Firm* — Pearl Cohen Zedek Lazer Baratz LLP

(57) ABSTRACT

A method for automated debugging of a design under test (DUT), including using a processor, (a) identifying a value of a signal at a specific time instance in which a user has indicated interest; (b) performing driver tracing based on structural analysis and signal analysis to determine one or a plurality of drivers of the identified value in the signal; (c) if the driver tracing returns a single driver of said one or a plurality of drivers, presenting the returned single driver to the user via an output device; and (d) if the driver tracing returns a plurality of drivers of said one or a plurality of drivers, performing formal analysis on a compiled substructure of the DUT to which all of said returned plurality of drivers are related to determine a single driver from said returned plurality of drivers, and presenting the determined single driver from said returned plurality of drivers to the user via the output device.

15 Claims, 7 Drawing Sheets

METHOD AND SYSTEM FOR AUTOMATED DEBUGGING OF A DEVICE UNDER TEST

FIELD OF THE INVENTION

The present invention relates to electronic design automation. More specifically the present invention relates to method and system for automated debugging of a device under test (DUT).

BACKGROUND

Electronic Design Automation (EDA) tools include software tools that can be used for designing electronic systems (e.g., printed circuit boards—PCB, integrated circuits—IC). EDA tools can be employed in a design flow designed by chip designers for designing, debugging and/or verifying electronic chips.

During the development process a Design Under Test (DUT) can be simulated and stimuli can be injected into the DUT simulation by a testbench. In this process debugging is often required to debug verification tests in the testbench environment and/or debug the DUT simulation model environment.

SUMMARY

There is thus provided, according to some embodiments of the present invention, a method for automated debugging of a design under test (DUT). The method may include: using a processor, a. identifying a value of a signal at a specific time instance in which a user has indicated interest; b. performing driver tracing based on structural analysis and signal analysis to determine one or a plurality of drivers of the identified value in the signal; c. if the driver tracing returns a single driver of said one or a plurality of drivers, presenting the returned single driver to the user via an output device; and d. if the driver tracing returns a plurality of drivers of said one or a plurality of drivers, performing formal analysis on a compiled sub-structure of the DUT to which all of said returned plurality of drivers are related to determine a single driver from said returned plurality of drivers, and presenting the determined single driver from said returned plurality of drivers to the user via the output device.

In some embodiments of the invention the sub-structure comprises a smallest module of the DUT to which all of the returned drivers relate.

According to some embodiments, the method may further include compiling the sub-structure of the DUT to which all of said returned plurality of drivers are related.

In some embodiments, the identifying the value in the signal to which a user has indicated interest may include receiving from the user a selection of the value.

In some embodiments, the identifying the value in the signal to which a user has indicated interest may include determining the value in the signal, based on tracking a current status of a debug tool performing the method.

According to some embodiments, the method may further include recording and saving the DUT's signals, and performing the driver tracing using the saved signals.

In some embodiments, the method may further include performing the formal analysis using the saved signal.

In some embodiments the method may further include recursively repeating steps a. to d. for another value in a signal in which a user has indicated interest.

There is also provided, in accordance with some embodiments of the invention, a method for value tracing through signals of a device under test DUT). The method may include: using a processor, a. identifying a value of a signal at a specific time instance in which a user has indicated interest; b. performing driver tracing based on structural analysis and signal analysis to determine one or a plurality of drivers of the identified value in the signal; c. if the driver tracing returns a plurality of drivers of said one or a plurality of drivers, performing formal analysis on a compiled sub-structure of the DUT to which all of said returned plurality of drivers are related to determine a single driver from said returned plurality of drivers; d. analyzing the single driver to determine which signals are contributing to the identified value assigned by that single driver that held the identified value at a time that identified value was assigned; e. recursively performing steps b., c. and d. on the identified contributing signals; and f. when no more contributing signals that held the identified value are found, presenting all identified contributing signals to the user via an output device.

According to some embodiments of the invention there is also provided a system for automated debugging of a DUT. The system may include a memory; and a processor, configured to a. identify a value of a signal at a specific time instance in which a user has indicated interest; b. perform driver tracing based on structural analysis and signal analysis to determine one or a plurality of drivers of the identified value in the signal; c. if the driver tracing returns a single driver of said one or a plurality of drivers, present the returned single driver to the user via an output device; and d. if the driver tracing returns a plurality of drivers of said one or a plurality of drivers, perform formal analysis on a compiled sub-structure of the DUT to which all of said returned plurality of drivers are related to determine a single driver from said returned plurality of drivers, and present the determined single driver from said returned plurality of drivers to the user via the output device.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention. Like components are denoted by like reference numerals.

DETAILED DESCRIPTION OF EMBODIMENTS OF THE INVENTION

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

In the process of developing electronic circuits (e.g., chips) the DUT is represented in the form of a model and simulated. There are various design languages. For various purposes the simulated model of the DUT is represented in such languages as VHDL, Verilog and the like (characterized as being declarative languages representing physical gates).

The simulated DUT, which is typically a software simulating electronic design (gates, logic, etc.) can be subjected to stimuli provided by a testbench, which is typically a software piece written in a verification language, such as e, system Verilog, C, etc. (which are used for constrained-random verification, characterized as programmatic, functional languages).

Figure 1:
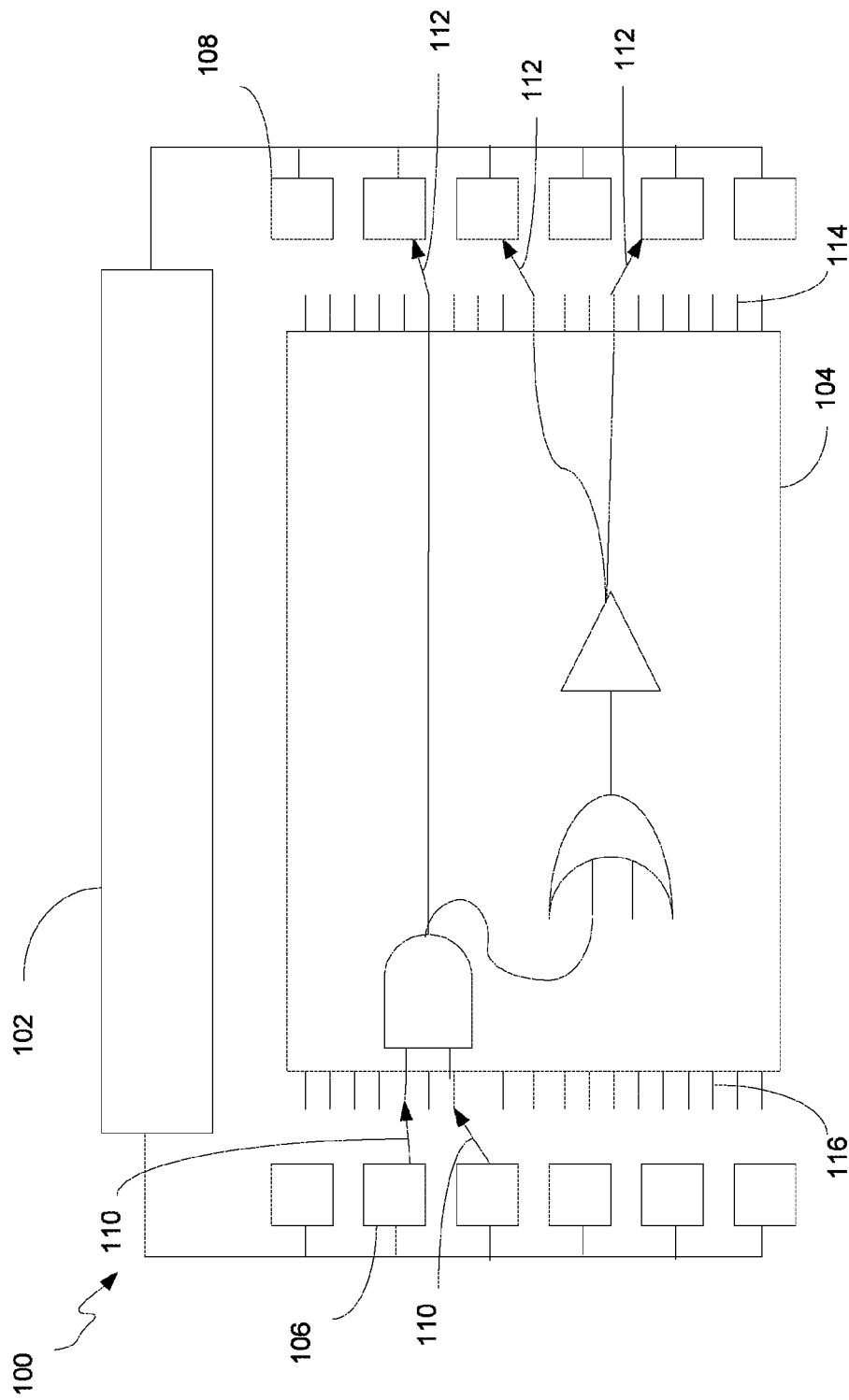
FIG. 1 illustrates a simulated Design Under Test (DUT) and a testbench according to some embodiments of the present invention.

FIG. 1 illustrates a simulated Design Under Test (DUT) and a testbench according to some embodiments of the present invention. The DUT 104 is a software simulation of an electronic design under test, and can be configured to receive stimuli via inputs 116 and/or produce output via outputs 114. The stimuli are input to the DUT by the output ports 106 of the testbench 100, whereas the outputs are collected by input ports 108 of testbench 100. The collected data is processed by the testbench 100 by processing unit or module 102 that can determine whether the collected outputs are valid results or invalid, so that unexpected results ("bugs") may be detected and flagged.

According to some embodiments of the present invention signals passing through connections of modules of a simulated DUT are recorded and saved. In some embodiments the signals passing through all connections of all of the DUT modules are recorded and saved. In some other embodiments of the invention, signals passing through connections of some of the modules of the DUT are recorded and saved. However, simulations typically involve many optimizations that are aimed at facilitating fast execution of the simulation, and attempting to record the signals through all of the connections of the DUT (that connect modules of the DUT or connect the DUT to input/s or output/s) may cause delays that would substantial prolong the simulation, and may use up a lot of resources. Thus, in some embodiments of the present invention a debug tool is configured to receive from a user (e.g., via an input device) a selection of locations on connections of the DUT (connected to one or more DUT modules), and record the signals passing through the selected DUT connections. Typically, the selected locations are at input connections through which stimuli are injected into the DUT, and at outputs of the DUT outputting signals out of the DUT, connections of inputs or outputs of modules of the DUT and other locations of interest.

Figure 2:
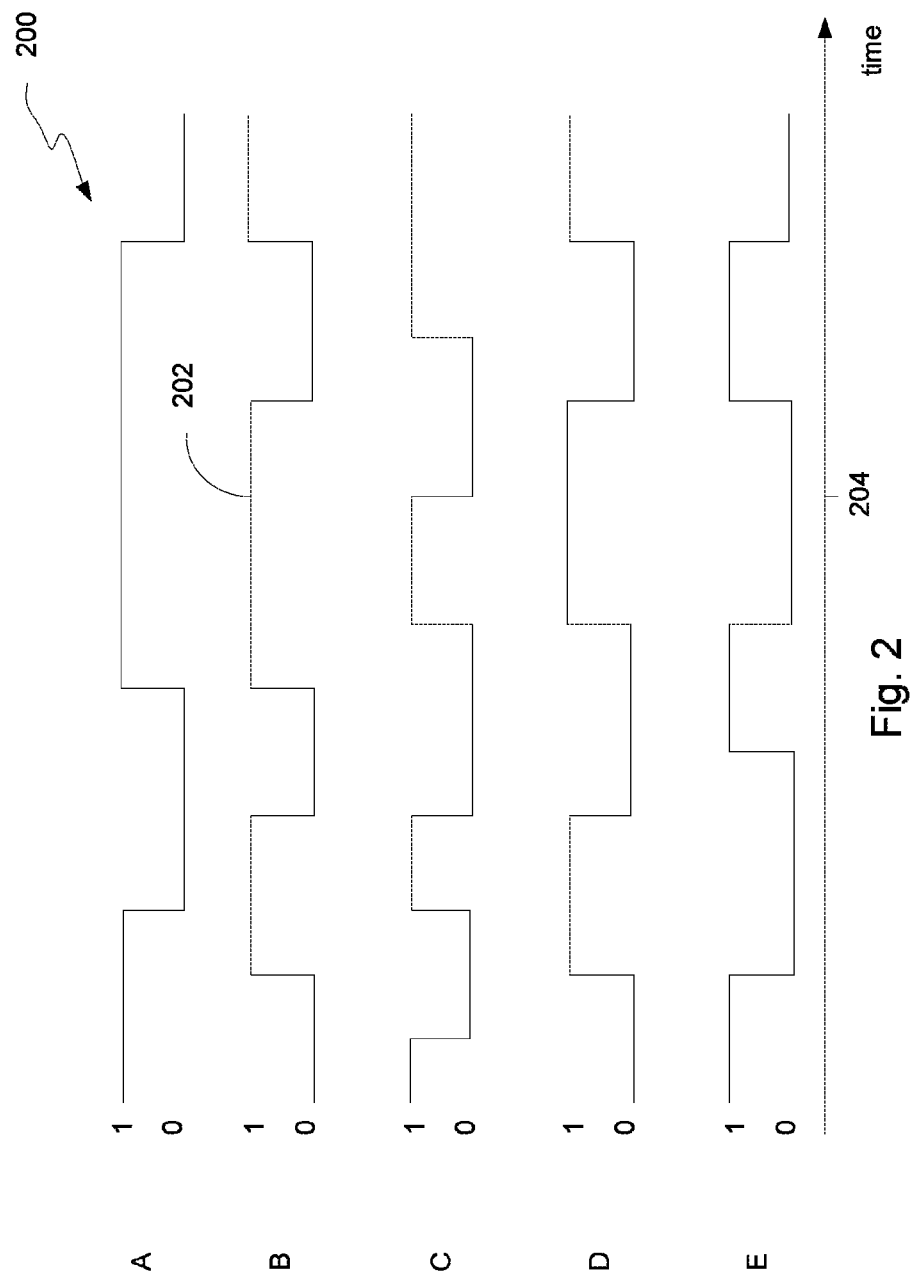
FIG. 2 illustrates a waveform of signals recorded and saved according to some embodiments of the present invention.

FIG. 2 illustrates a waveform of signals, recorded according to some embodiments of the present invention. In this example, the signals at locations A, B, C, D and E are plotted against time.

In accordance with some embodiments of the present invention, the recorded signals are then searched for bugs. "Bug" in the context of DUT simulation refers to detecting value or values in a signal that is or are not as expected (e.g., "0" instead of "1" and vice versa).

According to some embodiments of the invention, the recorded signals are saved in a database.

The recorded signals may be used for debugging the DUT using a post-process debug tool in accordance with the present invention.

There are (for example) two known approaches to debugging DUT based on recorded signals: driver tracing and formal analysis.

Driver tracing is an automated computerized dynamic heuristic analysis process that involves analyzing the sampled signals, and identifying the drivers that caused a specific value of the wave at a particular time based on structural analysis of the DUT (usually that is facilitated by IEEE standardized tools). For example, a user may wish to find driver that caused the value of signal B of the waveform shown in FIG. 2 to be "1" (202) at time instance 204.

A driver tracing algorithm may be used for discovering the driver of a specific value being propagated for a register-transfer level (RTL) signal. Typically, a driver tracing algorithm is heuristic with less than 100 percent accuracy (in many instances only about 80% accuracy) on average, it may produce results in a matter of seconds. In addition, such algorithm can indicate when there is a problem of accuracy.

When reviewing the behavior of the signal of the waveform sometimes it is simple to determine what was a specific driver (hereinafter—the "driver") for a certain value at a given time instance (hereinafter—the "effect"), that is, why a specific signal presented a specific value at a certain time, if the structural analysis of the DUT returns a clear deterministic structural reason e.g., the value is "1" because there is only one element linked to that connection that has generated the value of "1" at that specific instance in time. However, there may be instances where several possible reasons may apply, which may pose a dilemma as the user may be presented with several possible drivers and would have to choose between. If the chosen possible driver eventually turns out to be false (that is, not the driver of the value of a signal at the given time), the user may be required to go back and review other possible drivers, which may prove to be a lengthy and inconvenient process. Driver tracing, being rather abstract in nature is capable of dealing with a rich collections of constructs.

Sometimes driver tracing in the recorded information cannot provide a decisive solution, as there may be several possible drivers that can be linked to a specific situation. The code below is provided as an example to understand some basic definitions and to appreciate the problem of finding several possible drivers.

Some definitions first: the "driver" of x is a code line (or lines) of code where x is being assigned a value. The "possible drivers of x" are all the lines of a code where x can be assigned a value. "Active drivers of x at time t"—once a driver tracing algorithm was used to determine the causes of x having the value that it does at time t—the "possible drivers of x" can be split to 2 groups: a. The drivers that we know for sure where not the ones that caused x to have that value b. the rest if the drivers. We refer to group b as "the active drivers of x at time t".

```
always @ (posedge clk)
begin : OUTPUT_LOGIC
    if (reset == 1'b1) begin
        data_out <= #1 0;
        valid_out <= #1 0;
        parity_out <= #1 0;                             (a)
        chnl_out <= #1 0;
        ready <= #1 1;
    end
    else begin
        case(state)
            READY :
                begin
                    ready <= #1 !(cha_read | chb_read);
                    data_out <= #1 cha_read == 1 ? cha_data :
                        chb_read == 1 ? chb_data : 0;
                    parity_out <= #1 cha_read == 1 ?        (b)
                    cha_parity :
                        chb_read == 1 ? chb_parity : 0;
                    valid_out <= #1 (cha_read | chb_read);
                    chnl_out <= #1 chb_read == 1 ? 1 : 0;
                end
            BUSY :
                begin
                    ready <= #1 0;
                    data_out <= #1 0;
                    parity_out <= #1 0;                  (c)
                    valid_out <= #1 0;
                    chnl_out <= #1 0;
                end
        endcase
    end
end // End Of Block OUTPUT_LOGIC
```

If the signal to trace is "parity_out", then the lines marked by (a), (b) and (c) are three possible drivers. Now, if the value being traced is other then zero (e.g., 0x85) it is clear that from the three possible drivers only the middle one (b) could have caused any value that is not zero (the others are just setting the value to be zero, hard coded) that means that in that case it would be the only active driver).

If, on the other hand, the value of "parity_out" is zero, a much more complicated calculation is needed to determine which of the possible drivers was the real driver for that value, but the driver tracing method may not be good enough to rule out all possible drivers but one, which leads to an indecisive situation.

Formal analysis, on the other hand, takes a mathematical approach in finding the driver of a specific value at a given time in a signal (see also U.S. Pat. No. 7,137,078 (Singhal et al.), incorporated herein by reference in its entirety). Typically, in formal analysis only a section (a sub-structure, such as, for example, a module of the DUT) or several sections of the DUT are considered. In formal analysis, a waveform and structural information relating to that section is compiled to generate a mathematical model (e.g., using binary decision diagram—BDD). Such mathematical model is characterized by the ability to determine injectively the driver for each effect investigated. The greater the modelled module the greater are the required computing time and memory to save that model. In principle it would have been sufficient enough to employ formal analysis to successfully determine all drivers for all effects, yet it is not feasible to conduct formal analysis on an entire DUT within reasonable time or given typical computational resources constraints. Formal analysis may be performed on a subset of the hardware description language (e.g., synthesizability etc.). Formal analysis is considered 100 percent accurate in providing a single driver for a certain value in a signal at a given instance of time. However, formal analysis requires a potentially long "warm-up" time (typically in many cases up to an hour) for the design to be elaborated before formal analysis may be performed. In addition, there are scalability limitations to this technique.

Figure 3:
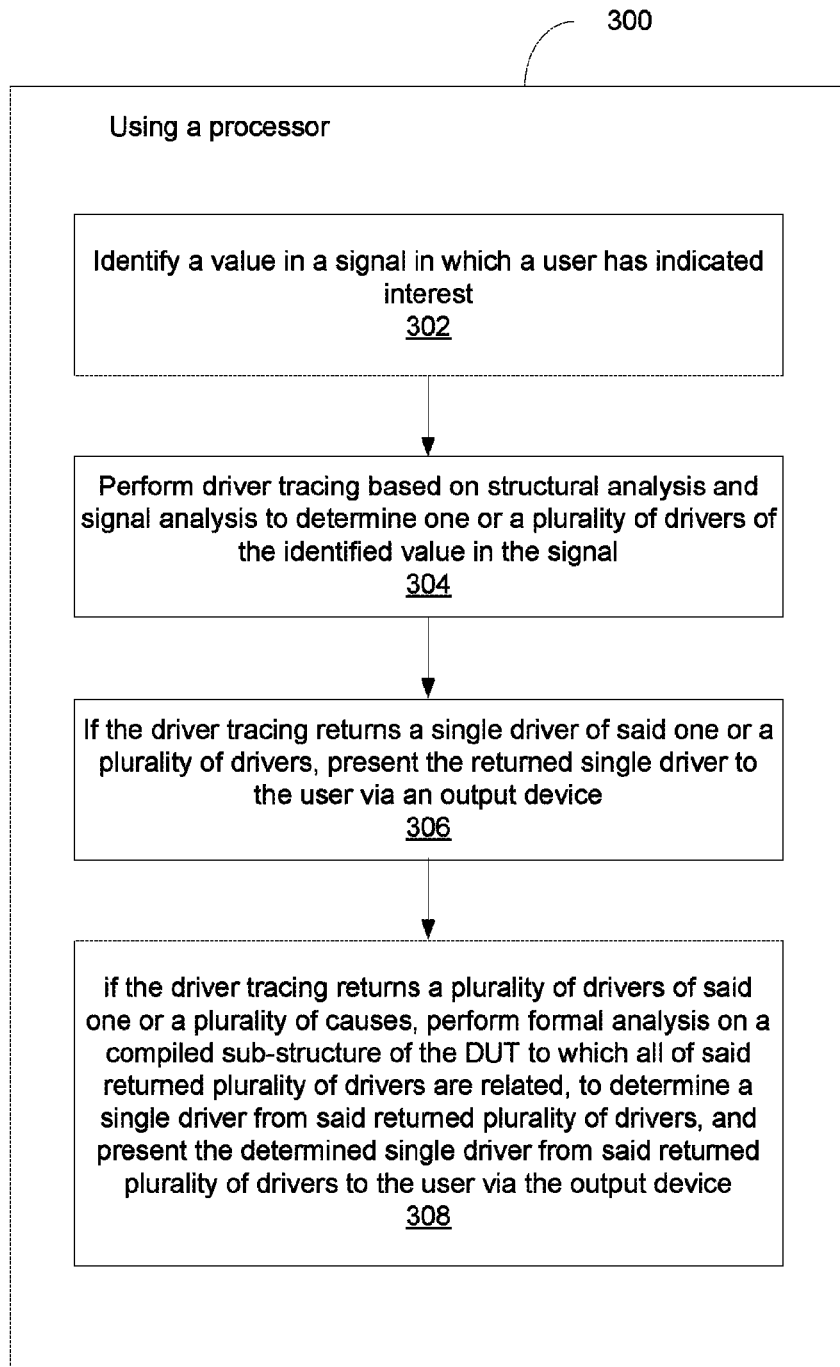
FIG. 3 illustrates a method for automated debugging of a DUT, according to some embodiments of the present invention.

FIG. 3 illustrates a method 300 for automated debugging of a DUT, according to some embodiments of the present invention. Such method 300 includes, using a processor:

a. identifying 302 a value of a signal at a specific time instance in a signal in which a user has indicated interest;

b. performing 304 driver tracing based on structural analysis and signal analysis to determine one or a plurality of drivers of the identified value in the signal;

c. if the driver tracing returns a single driver of said one or a plurality of drivers, presenting 306 the returned single driver to the user via an output device; and d. if the driver tracing returns a plurality of drivers of said one or a plurality of drivers, performing 308 formal analysis on a compiled sub-structure of the DUT to which all of said returned plurality of drivers are related, to determine a single driver from said returned plurality of drivers, and presenting the determined single driver from said returned plurality of drivers to the user via the output device.

Identifying a value of a signal at a specific time instance in a signal in which a user has indicated interest may be achieved in various ways. One way may involve receiving from the user, for example via an input device, a selection of the value of interest. Another way may involve tracking the current state of the debug tool which may include detecting the actions of the user, detecting the location of the cursor on or next to a code line, or on or next to a signal or a location thereon, detecting the status of a current executed function or functions of the debug tool and other status events of the debug tool that may point, directly or implicitly, to a value of interest.

Identifying the sub-structure of the DUT to which all of said returned plurality of drivers are related may be based on structural analysis of the DUT and determining the smallest module to which all of the returned drivers relate. A module may be determined by identifying a sub-structure of the DUT which has identifiable inputs and outputs and is confined between these inputs and outputs. There may be various kinds of modules in a DUT. For example, there may be inclusion hierarchy—one or more modules included within a greater module. There may be modules presenting parent and child like relations (the parent module exceeding the child module). There may also be sibling modules (same hierarchy level).

Typically the structural design of a DUT and substructures of the DUT may be identified using services that are provided by various simulator vendors, such as, for example, Verilog program interface (VPI) and VHDL program interface (VHPI).

Identifying the smallest sub-structure of the DUT to which all of said returned plurality of drivers are related may be achieved in one or more ways. One way may be identifying the driving signals which relate to each of the possible drivers and construct a graph (typically from the bottom up). The node which is shared by all possible drivers corresponds to the smallest sub-structure of the DUT to which all of said returned plurality of drivers are related.

For example, Identifying the smallest common sub-structure of the DUT which encompasses all of said returned plurality of drivers may be achieved using the following simple algorithm:
1. Identify the set of all driving signals which are related to each of the possible drivers.
2. For each such signal, find the enclosing structure.
3. For the set of enclosing structures, find the smallest parent enclosing structure which contains all of them.

According to some embodiments of the present invention identifying of the value of a signal at a specific time instance in the signal to which a user has indicated interest may include receiving from the user a selection of the value. The user may provide the selection via an input device, such as, for example a pointing device, keyboard, touch sensitive screen, or other input devices.

In some embodiments identifying the value of a signal at a specific time instance to which a user has indicated interest comprises determining the value in the signal, based on tracking a current status of a debug tool performing the method.

In some embodiments of the invention, the method may further include recording and saving the signals, and performing the driver tracing using the saved signals, in what is referred to as "post-process debugging".

According to some embodiments of the invention, the method may further include performing the formal analysis using the saved signals, in "post-process debugging".

According to embodiments the method may further include recursively repeating the above method steps for other values in a signal in which a user has indicated interest. When performing the method recursively, the sub-structure of the DUT to which all of said returned plurality of drivers are related (e.g., a module of the DUT), the method may include compiling the sub-structure. This may not be needed later on in situations where other returned possible drivers relate to the already compiled sub-structure.

Figure 4:
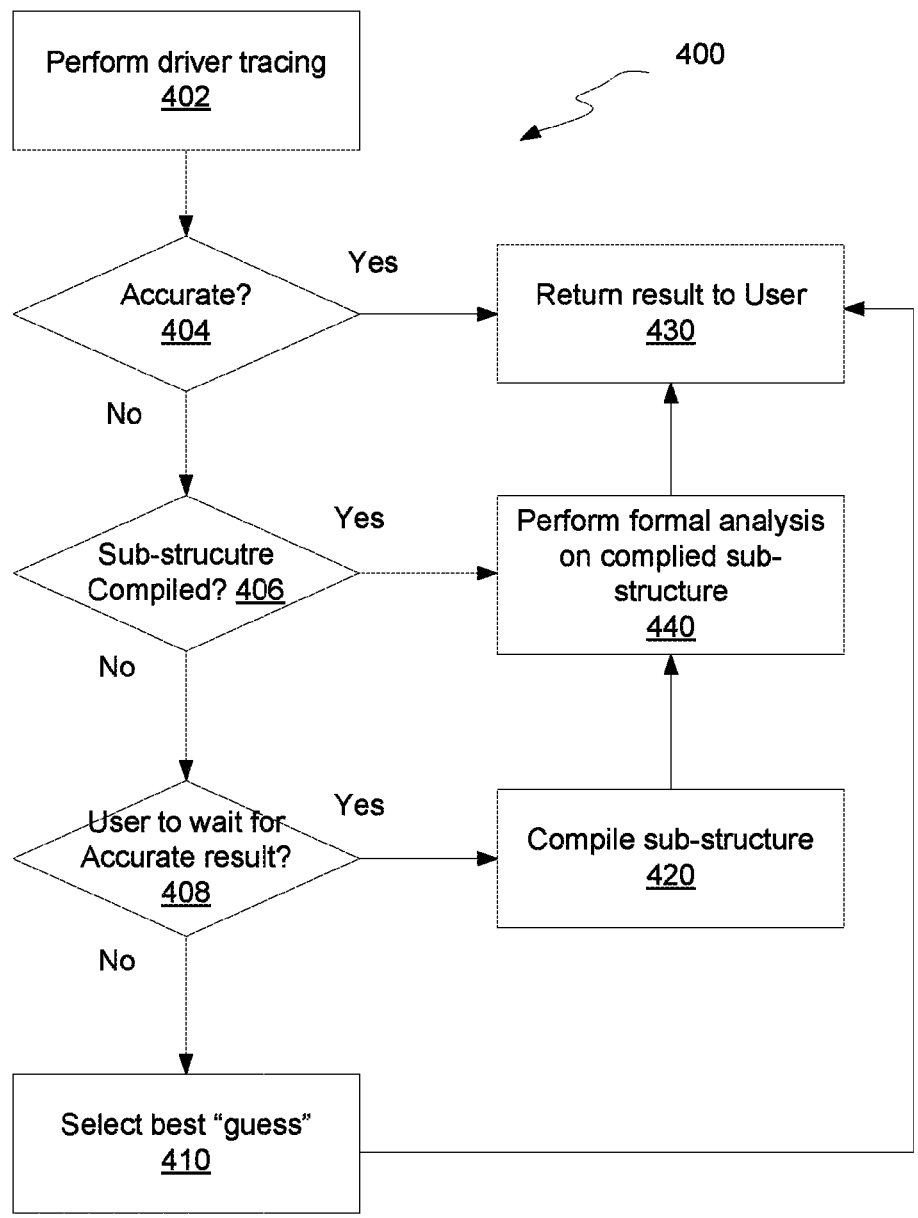
FIG. 4 illustrates an algorithm for automated debugging of a DUT, according to some embodiments of the present invention.

FIG. 4 illustrates an algorithm 400 for automated debugging of a DUT, according to some embodiments of the present invention.

Algorithm 400 starts by performing 402 driver tracing. It is then determined 404 whether the driver tracing has produced an accurate result (e.g., a single driver found). If an accurate result was produced the algorithm goes on to return 430 the result to the user. If no accurate result was obtained, then it is determined 406 whether a sub-structure of the DUT to which all of said returned plurality of drivers are related was previously compiled for formal analysis. If it was previously compiled, then the algorithm goes on to perform 440 formal analysis of the compiled sub-structure, and returns the result 430 to the user.

If the sub-structure was not previously compiled, then it is determined 408 whether the user wishes to wait for an accurate result. This may be determined by presenting a question to the user via a user interface and obtaining a response from the user. This is so because the compiling of the sub-structure may take up a considerable time.

If the user wishes to wait for an accurate result then the algorithm goes on to perform 420, compilation of the sub-structure, perform formal analysis 440 on the compiled sub-structure and return the result 430 to the user. If the user does not wish to wait for an accurate result, then a best "guess" is selected 410 and returned 430 to the user. In another embodiment all of the active drivers may be returned to the user, allowing the user to explore all of them and decide for himself.

In some embodiments of the invention it may be desired to trace a particular value of a signal that is not a binary value ("0" or "1"). For example, the signal may include a large variety of values (e.g., 8, 16 or 32 bit signal, etc.). The user may wish to track a particular value and determine how it was propagated through the DUT up to the earliest driver that has actually generated that value. This may involve detecting a large number of instances through which that particular value has propagated and tracking these events all the way to the initial generation of that value.

Value Tracing may be executed by performing driver tracing on the specified signal at the specified time, determining the active drivers, identifying the contributing signals (signals whose values are taking part in the assignment of the traced signal) in those active drivers and the values of said contributing signals at the relevant time. If such a contributing signal is found to be holding the same value as the traced value—the same process will then be executed for that signal. This process will continue recursively until a signal is found which is holding the traced value, but in none of his active drivers there is a contributing signal holding the said value. That signal is supposed to be the signal where the traced value was originally created and it is being presented to the user along with all the signals through which the value propagated until reaching the initially traced signal.

Figure 5:
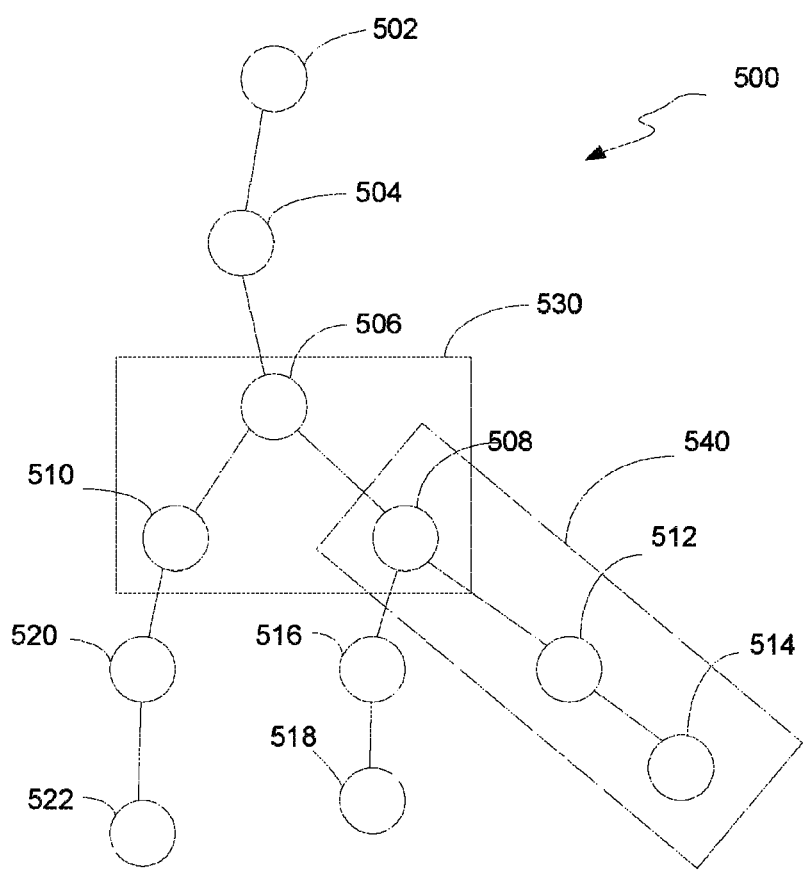
FIG. 5 illustrates a graph for use in a method for value tracing, in accordance with some embodiments of the present invention.

FIG. 5 illustrates a graph for use in a method for value tracing, in accordance with some embodiments of the present invention.

When a user selects a certain value, at a particular instance of time in a signal e.g., 502, a method of value tracing goes back to detect all events in the evolvement of that value. The previous event 504 is detected and so is event 506, but there two possibilities for drivers are detected, one leading to event 508 and one to event 510, both stemming from the same previous event 506. Event 508 itself has stemmed from event 512, which in turn have stemmed from event 514, or event 516, which stemmed from 518. Event 510 has stemmed from event 520 which itself has stemmed from event 522. As there are several places where there is more than one possible driver, the chances of making a mistake in the value tracing are increased.

Thus, in accordance with some embodiments of the present invention, a method for value tracing in a signal includes performing value tracing along the graph, until a node connecting more than two edges is reached, at which point formal analysis may be performed on a sub-structure. For example, at node 506, which connects to more than two edges, sub-structure 530 may be processed in formal analysis, whereas at node 508, sub-structure 540 may be processed in formal analysis.

The selection of a sub-structure for compiling may involve other considerations. For example, the design connectivity of various modules of the DUT may be related to. In another example, the sub-structure may be greater than the smallest sub-structure of the DUT to which all of said returned plurality of drivers are related. This may be, for example, the case when it is determined that it is advantageous to compile a greater sub-structure and conduct formal analysis on that sub-structure.

In some embodiments of the invention, the decision of which sub-structure to compile, in order to use formal analysis is postponed until the tree of events expanded by driver tracing reaches a certain number of branching points, thus allowing to determine and compile a bigger sub-structure that would be more beneficial as it will enable using formal analysis for trimming down false branches in more branching points in that tree.

Figure 6:
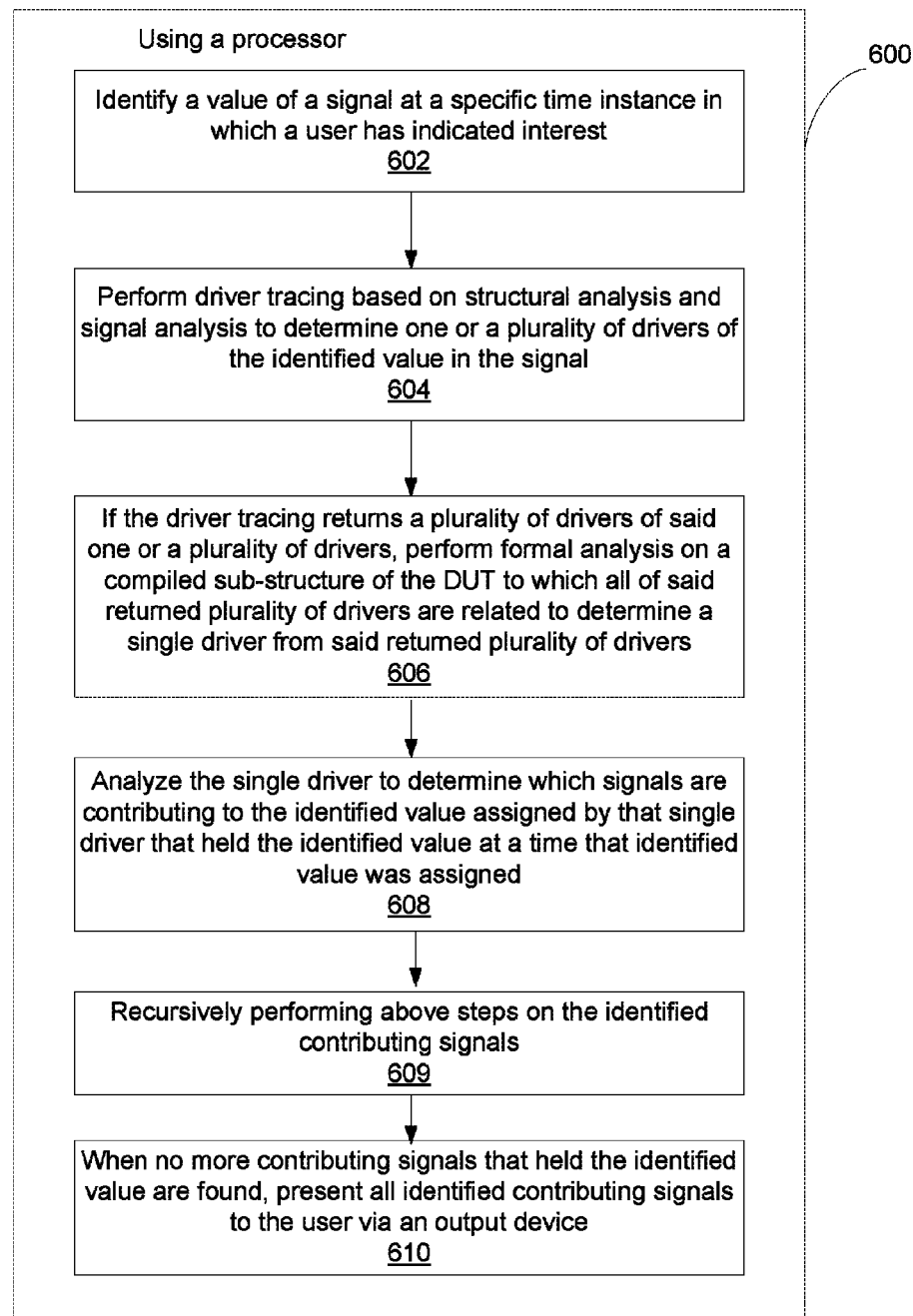
FIG. 6 illustrates a method for value tracing, in accordance with some embodiments of the present invention.

FIG. 6 illustrates a method for value tracing, in accordance with some embodiments of the present invention. Method 600 may include:

a. identifying 602 a value of a signal at a specific time instance in which a user has indicated interest;

b. performing 604 driver tracing based on structural analysis and signal analysis to determine one or a plurality of drivers of the identified value in the signal;

c. if the driver tracing returns a plurality of drivers of said one or a plurality of drivers, performing 606 formal analysis on a compiled sub-structure of the DUT to which all of said returned plurality of drivers are related to determine a single driver from said returned plurality of drivers;

d. analyzing 608 the single driver to determine which signals are contributing to the identified value assigned by the single driver that held the identified value at the a time that identified value was assigned;

e. recursively performing 609 steps b., c. and d. on the identified contributing signals; and f. when no more contributing signals that held the identified value are found, presenting 610 all identified contributing signals to the user via an output device.

In some embodiments of the invention, formal analysis may be postponed until the driver tracing is completed, and then a sub-structure of the DUT that relates to all branching points where the driver tracing returned more than one driver may be compiled for performing formal analysis only on that sub-structure (to save precious processing time).

Figure 7:
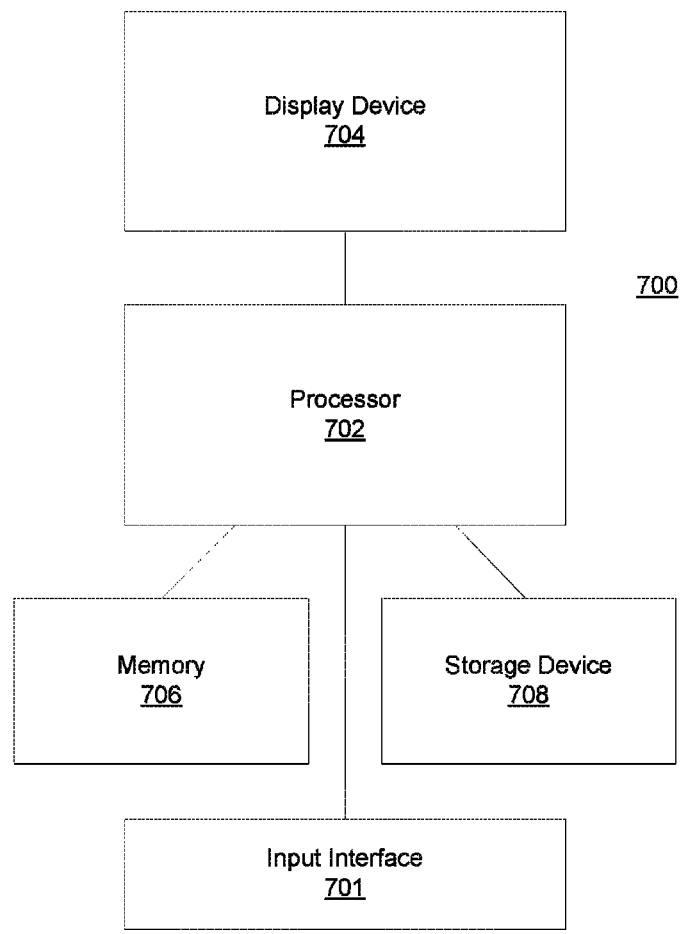
FIG. 7 illustrates a system for automated debugging of a DUT, according to some embodiments of the present invention.

FIG. 7 illustrates a system for automated debugging of a DUT, according to some embodiments of the present invention.

System 700 may include a processor 702 (e.g. one or a plurality of processors, on a single machine or distributed on a plurality of machines) for executing a method according to some embodiments of the present invention. Processor 702 may be linked with memory 706 on which a program implementing a method according to some embodiments of the present invention and corresponding data may be loaded and run from, and storage device 708, which includes a non-transitory computer readable medium (or mediums) such as, for example, one or a plurality of hard disks, flash memory devices, etc. on which a program implementing a method according to some embodiments of the present invention and corresponding data may be stored. System 700 may further include an output device 704 (e.g. display device such as CRT, LCD, LED etc.) on which one or a plurality user interfaces associated with a program implementing a method according to some embodiments and corresponding data may be presented. System 700 may also include input interface 701, such as, for example, one or a plurality of keyboards, pointing devices, touch sensitive surfaces (e.g. touch sensitive screens), etc. for allowing a user to input commands and data.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A method for automated debugging of a design under test (DUT), the method comprising:
   using a processor,
   a. identifying a value of a signal that is output by a simulation of application of a stimulus to a hardware circuit at a specific time instance in which a user has indicated interest;
   b. performing driver tracing based on structural analysis and signal analysis to identify one or a plurality of drivers of the identified value in the signal;
   c. if said one or a plurality of drivers consists of a single driver, presenting the returned single driver to the user via an output device; and
   d. if said one or a plurality of drivers comprises a plurality of drivers, identifying a smallest sub-structure of the DUT that encompasses said plurality of drivers, compiling a waveform and structural information related to the identified sub-structure generate a compiled sub-structure if the compiled sub-structure was not previously compiled to generate the compiled sub-structure, performing formal analysis on the compiled sub-structure to determine a single driver from said returned plurality of drivers, and presenting the determined single driver from said returned plurality of drivers to the user via an output device.

2. The method of claim 1, wherein identifying the value in the signal to which a user has indicated interest comprises receiving from the user a selection of the value.

3. The method of claim 1, wherein identifying the value in the signal to which a user has indicated interest comprises determining the value in the signal, based on tracking a current status of a debug tool performing the method.

4. The method of claim 1, further comprising recording and saving the DUT's signals, and performing the driver tracing using the saved signals.

5. The method of claim 4, further comprising performing the formal analysis using the saved signal.

6. The method of claim 1, further comprising recursively repeating steps a. to d. for another value in a signal in which a user has indicated interest.

7. A method for value tracing through signals of a device under test (DUT), the method comprising:
using a processor,
a. identifying a value of a signal that is output by a simulation of application of a stimulus to a hardware circuit at a specific time instance in which a user has indicated interest;
b. performing driver tracing based on structural analysis and signal analysis to identify one or a plurality of drivers of the identified value in the signal;
c. if said one or a plurality of drivers consists of a plurality of drivers, performing formal analysis on a compiled sub-structure of the DUT to which all of said returned plurality of drivers are related to determine a single driver from said returned plurality of drivers;
d. analyzing the single driver to determine which signals are contributing to the identified value assigned by that single driver that held the identified value at a time that identified value was assigned;
e. recursively performing steps b., c. and d. on the identified contributing signals; and
f. when no more contributing signals that held the identified value are found, presenting all identified contributing signals to the user via an output device.

8. The method of claim 7, further comprising postponing formal analysis until value tracing is completed, and then compiling a sub-structure of the DUT that relates to all branching points where the driver tracing returned more than one driver.

9. A system for automated debugging of a design under test DUT, the system comprising:
a memory; and
a processor, configured to
a. identify a value of a signal that is output by a simulation of application of a stimulus to a hardware circuit at a specific time instance in which a user has indicated interest;
b. perform driver tracing based on structural analysis and signal analysis to identify one or a plurality of drivers of the identified value in the signal;

c. if said one or a plurality of drivers consists of a single driver, present the returned single driver to the user via an output device; and
d. if said one or a plurality of drivers comprises a plurality of drivers, identify a smallest sub-structure of the DUT that encompasses said plurality of drivers, compile a waveform and structural information related to the identified sub-structure to generate a compiled sub-structure if the sub-structure was not previously compiled to generate the compiled sub-structure, perform formal analysis on the compiled sub-structure to determine a single driver from said returned plurality of drivers, and present the determined single driver from said returned plurality of drivers to the user via the output device.

10. The system of claim 9, wherein in identifying the value in the signal to which a user has indicated interest the processor is configured to receive from the user a selection of the value.

11. The system of claim 9, wherein in identifying the value in the signal to which a user has indicated interest the processor is configured to determine the value in the signal, based on tracking a current status of a debug tool.

12. The system of claim 9, wherein the processor is further configured to record and save the signal, and perform the driver tracing using the saved signal.

13. The system of claim 12, wherein the processor is further configured to perform the formal analysis using the saved signal.

14. The system of claim 9, wherein the processor is further configured to recursively repeat steps a. to d. for other values in a signal in which a user has indicated interest.

15. A non-transitory computer readable storage medium for automated debugging of a design under test DUT, having stored thereon instructions that when executed by a processor will cause the processor to:
a. identify a value of a signal that is output by a simulation of application of a stimulus to a hardware circuit at a specific time instance in which a user has indicated interest;
b. perform driver tracing based on structural analysis and signal analysis to identify one or a plurality of drivers of the identified value in the signal;
c. if said one or a plurality of drivers consists of a single driver, present the returned single driver to the user via an output device; and
d. if said one or a plurality of drivers comprises a plurality of drivers, identify a smallest sub-structure of the DUT that encompasses said plurality of drivers, compile a waveform and structural information related to the identified sub-structure to generate a compiled sub-structure if the sub-structure was not previously compiled to generate the compiled sub-structure, perform formal analysis on the compiled sub-structure to determine a single driver from said returned plurality of drivers, and present the determined single driver from said returned plurality of drivers to the user via the output device.

* * * * *